(12) United States Patent
Gudeman et al.

(10) Patent No.: US 10,011,478 B2
(45) Date of Patent: Jul. 3, 2018

(54) THERMOCOMPRESSION BONDING WITH RAISED FEATURE

(71) Applicant: Innovative Micro Technology, Goleta, CA (US)

(72) Inventors: Christopher S. Gudeman, Lompoc, CA (US); Paul J. Rubel, Santa Barbara, CA (US)

(73) Assignee: Innovative Micro Technology, Goleta, CA (US)

( * ) Notice: Subject to any disclaimer, the term of this patent is extended or adjusted under 35 U.S.C. 154(b) by 0 days.

(21) Appl. No.: 15/634,230

(22) Filed: Jun. 27, 2017

(65) Prior Publication Data
US 2017/0334712 A1 Nov. 23, 2017

Related U.S. Application Data

(63) Continuation-in-part of application No. 15/149,217, filed on May 9, 2016, now abandoned.

(60) Provisional application No. 62/163,308, filed on May 18, 2015.

(51) Int. Cl.
| | | |
|---|---|---|
| *H01L 23/48* | (2006.01) | |
| *B81B 7/00* | (2006.01) | |
| *B81C 1/00* | (2006.01) | |
| *B23K 20/02* | (2006.01) | |
| *B32B 9/04* | (2006.01) | |

(52) U.S. Cl.
CPC .......... *B81B 7/0058* (2013.01); *B23K 20/023* (2013.01); *B32B 9/041* (2013.01); *B81C 1/00269* (2013.01); *B32B 2457/00* (2013.01)

(58) Field of Classification Search
CPC ...... H01L 24/06; B81B 7/0053; B23K 20/023
USPC ................................................ 257/737, 704
See application file for complete search history.

(56) References Cited

U.S. PATENT DOCUMENTS

| | | | | | |
|---|---|---|---|---|---|
| 5,148,261 | A | * | 9/1992 | Kang ................... | B23K 20/023 257/784 |
| 6,142,358 | A | * | 11/2000 | Cohn ................... | B23K 1/0016 228/120 |
| 2002/0140094 | A1 | * | 10/2002 | Kubota ................. | H01L 24/11 257/737 |
| 2006/0261476 | A1 | * | 11/2006 | Fjelstad .............. | H01L 23/3114 257/737 |
| 2007/0048898 | A1 | | 3/2007 | Carlson et al. | |
| 2009/0029152 | A1 | * | 1/2009 | Yun ..................... | B81C 1/00269 428/328 |
| 2009/0091024 | A1 | * | 4/2009 | Zeng ................... | B23K 1/0016 257/737 |

(Continued)

*Primary Examiner* — Nitin Parekh
(74) *Attorney, Agent, or Firm* — Jaquelin K. Spong

(57) ABSTRACT

A method for bonding two substrates is described, comprising providing a first and a second silicon substrate, providing a raised feature on at least one of the first and the second silicon substrate, forming a layer of gold on the first and the second silicon substrates, and pressing the first substrate against the second substrate, to form a thermocompression bond around the raised feature. The high initial pressure caused by the raised feature on the opposing surface provides for a hermetic bond without fracture of the raised feature, while the complete embedding of the raised feature into the opposing surface allows for the two bonding planes to come into contact. This large contact area provides for high strength.

10 Claims, 5 Drawing Sheets

(56) References Cited

U.S. PATENT DOCUMENTS

| | | | |
|---|---|---|---|
| 2013/0083038 A1* | 4/2013 | He | B81B 7/0058 |
| | | | 345/501 |
| 2013/0106868 A1* | 5/2013 | Shenoy | B81C 1/00269 |
| | | | 345/501 |
| 2014/0252604 A1* | 9/2014 | Motoyoshi | H01L 24/11 |
| | | | 257/737 |
| 2014/0261960 A1 | 9/2014 | Lin et al. | |
| 2015/0059847 A1 | 3/2015 | Ravi et al. | |
| 2015/0200172 A1 | 7/2015 | Lii et al. | |
| 2015/0325507 A1* | 11/2015 | Uzoh | H01L 23/49811 |
| | | | 257/737 |

\* cited by examiner

THERMOCOMPRESSION BONDING WITH RAISED FEATURE

CROSS REFERENCE TO RELATED APPLICATIONS

This U.S. Patent Application is a continuation in part from U.S. patent application Ser. No. 15/149217, filed May 9, 2016, which claims priority to U.S. Provisional Patent Application 62/163,308 filed May 18, 2015, each of which is incorporated by reference in its entirety.

STATEMENT REGARDING FEDERALLY SPONSORED RESEARCH

Not applicable.

STATEMENT REGARDING MICROFICHE APPENDIX

Not applicable.

BACKGROUND

This invention relates to a methodology for bonding together two microfabrication substrates.

Microelectromechanical systems are devices which are manufactured using lithographic fabrication processes originally developed for producing semiconductor electronic devices. Because the manufacturing processes are lithographic, MEMS devices may be made in quantity and in very small sizes. MEMS techniques have been used to manufacture a wide variety of transducers and actuators, such as accelerometers and electrostatic cantilevers.

Since MEMS devices are often movable, they may be enclosed in a rigid structure, or device cavity formed between two substrates, so that their small, delicate structures are protected from shock, vibration, contamination or atmospheric conditions. Many such devices also require an evacuated environment for proper functioning, so that these device cavities may need to be hermetically sealed after evacuation. Thus, the device cavity may be formed between two substrates which are bonded using a hermetic adhesive.

Thermocompression bonds (TCBs) are known for achieving a hermetic seal between two flat surfaces. Thermocompression bonds can be strong when the bonding area is large. However, in some cases, surface roughness will generally obviate a hermetic bond, due to the separation of the two bonding planes by surface asperities. On the other hand a TCB can be hermetic if the bond area is small, because loading force during bonding can plastically deform the surface asperities to the point that the two bonding planes are no longer separated. However in this case the bond will be weak.

Also, when the bondline is made increasingly narrow, it becomes likely that it will fracture under the high loading pressure (>=10 MPa) required for adequate asperity deformation. This adversely affects yield.

Higher temperature bonds often mitigate the problem due to softening of the bonding interface, but many products cannot tolerate these high temperatures (>=300 C).

Accordingly, the packaging of microfabricated devices in a hermetic cavity remains an unresolved problem.

SUMMARY

The current invention uses a raised feature on one of the bonding surfaces to achieve a hermetic thermocompression bond. The height and radius of curvature of this feature can be precisely controlled. Because the feature is curved (cylindrical, pyramidal or spherical, for example), it is extremely robust to the loading pressure that is applied during the bond process. Furthermore the raised feature, which is centered on a broad bondline is made with a very small radius of curvature (<=5 microns). Under the loading pressure, during bonding, the raised feature is completely embedded in the opposing surface. This brings the two bonding planes into contact. Thus the high initial pressure of the raised feature on the opposing surface provides for a hermetic bond without fracture of the raised feature, while the complete embedding of the raised feature into the opposing surface allows for the two bonding planes to come into contact. This large contact area provides for high strength.

Accordingly, a method may include providing a first and a second substrate, forming a first layer of a metal over the first substrate, providing a raised feature the second substrate; forming a second layer of a metal over the raised feature on the second substrate, pressing the first substrate against the second substrate to form a substrate pair, with a temperature, pressure and duration sufficient to achieve a thermocompression bond, and bonding the substrate pair with a thermocompression bond between the first metal layer and the second metal layer, around the raised feature, wherein adhesive bonding strength between the first substrate and the second substrate is in the vicinity of the raised feature as a result of thermocompression bond.

The resulting device may comprise a bond between a first substrate and a second substrate, wherein the bond includes a first metal layer on the first substrate, a raised feature formed on the second substrate, and a second metal layer over the second substrate and the raised feature, wherein adhesive bonding strength between the first substrate and the second substrate is in a vicinity of the raised feature as a result of thermocompression bonding between the first metal layer and the second metal layer, wherein the peak of the raised feature has a radius of curvature in its lateral cross sectional profile of less than about 5 microns, and this peak is embedded in the bond.

These and other features and advantages are described in, or are apparent from, the following detailed description.

BRIEF DESCRIPTION OF THE DRAWINGS

Various exemplary details are described with reference to the following figures, wherein.

It should be understood that the drawings are not necessarily to scale, and that like numbers may refer to like features.

DETAILED DESCRIPTION

A thermocompression bond is characterized by atomic motion between two surfaces brought into close contact. The atoms migrate from one crystal lattice to the other one based on crystal lattice vibration. This atomic interaction adheres the surfaces. Thermocompression bonding using two layers of gold (Au) is known, but the technique has the deficiencies described above. Other materials may also be capable of thermocompression bonding, including aluminum (Al) and copper (Cu) bonds. Although the embodiment described below is directed to a gold thermocompression bond, it should be understood that the techniques may be applied to other materials as well, such as aluminum (Al) and copper (Cu).

In one embodiment, the substrate and the raised feature are both silicon, and the first metal layer and the second metal layer are both gold, with a thickness of about 0.5 to 6 microns. In other embodiments, the substrates may comprise at least one of glass, metal, semiconductor and ceramic. In the discussion which follows, methods will be described for the general case of a pair of fabrication substrates and metal layers of undefined composition, as well as methods suited to silicon substrates and gold layers in particular.

Figure 1A:
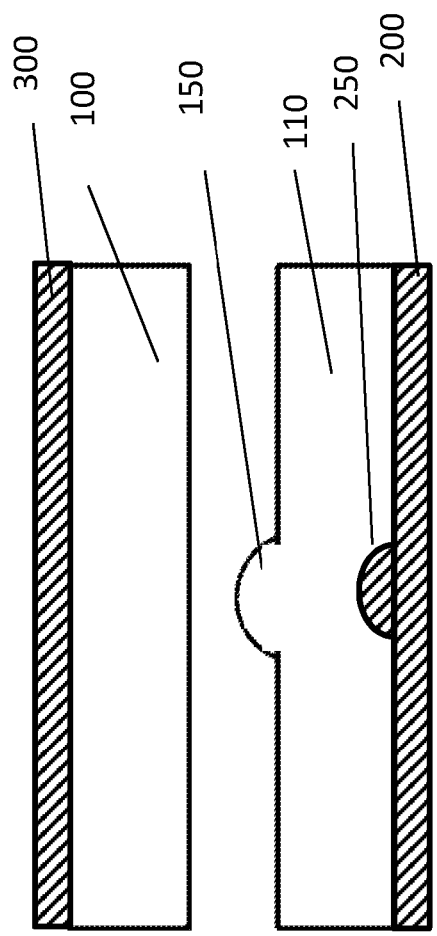
FIG. 1A is a schematic cross sectional diagram of the bonding layers and raised feature prior to bonding.

FIG. 1A shows two bonding surfaces 100, 110 before bonding. Preferably these surfaces are metal layers, composed of Au that is 0.5 microns to 6.0 microns in thickness. One surface 110 also has a raised feature 150 formed therein. The raised feature 150 in the gold layer 110 may be a result of a conformal deposition of the gold material over a substrate 200 with a corresponding raised feature 250 formed thereon. As will be described below, adhesive bonding strength may exist near this raised feature 150 when applied against an opposing gold layer 100 on a second substrate 300.

Accordingly, shown in FIG. 1A is a first layer 100 of a first metal formed on a first substrate 300, a second layer 110 of a metal formed over a raised feature 250 on a second substrate 200. The conformal deposition of the second metal layer 110 may result in a corresponding raised feature 150 in the second metal layer.

The device according to this process may include a bond between a first substrate and a second substrate, comprising a first metal layer on the first substrate, a raised feature on the second substrate; and a second metal layer over the second substrate and the raised feature, wherein adhesive bonding strength between the first substrate and the second substrate is in a vicinity of the raised feature as a result of thermocompression bonding between the first metal layer and the second metal layer, wherein the peak of the raised feature has a radius of curvature in its lateral cross sectional profile of less than about 5 microns, and this peak is embedded in the bond. It should be understood that "in the vicinity of the raised feature" may mean a region spanning about 10 diameters of the raised feature.

Figure 2:
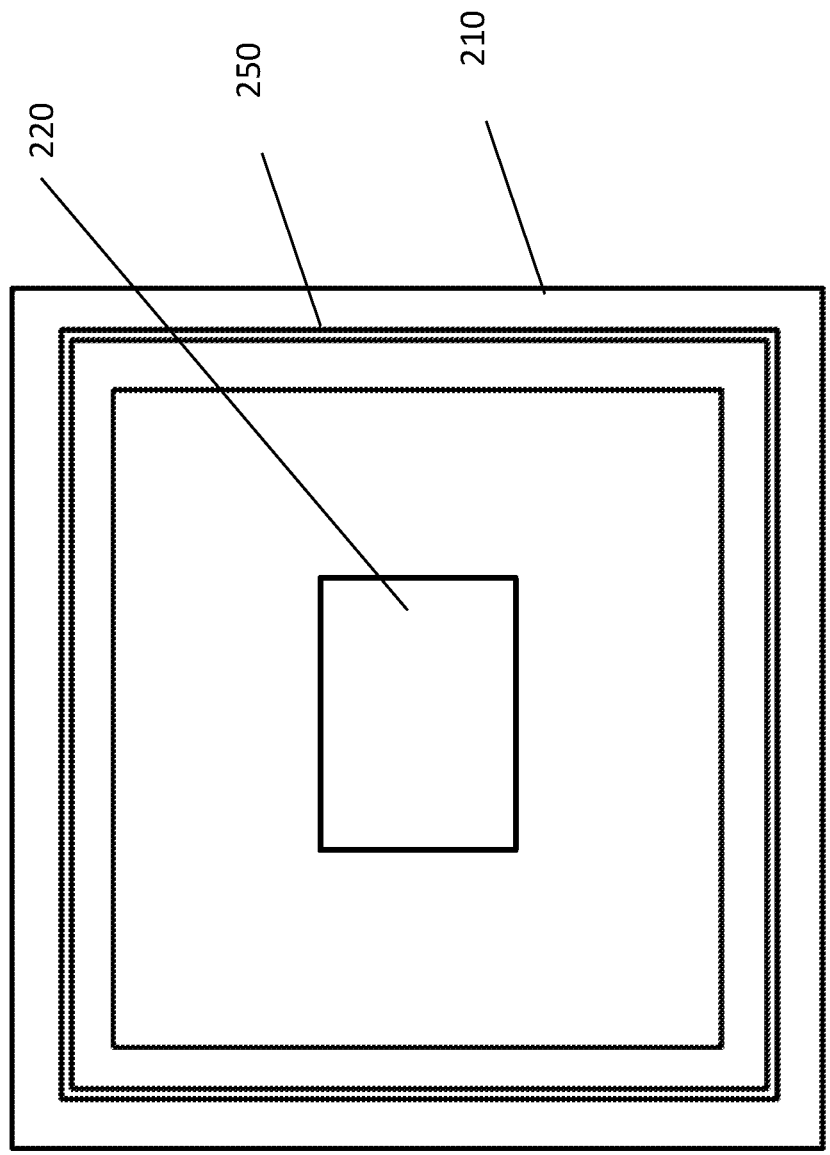
FIG. 2 is a plan view of the bond, raised feature, and sealed device after bonding.

The raised feature 250 in substrate 200 may be formed by the process described below with respect to FIGS. 3A-3F and FIG. 5. The width (or diameter) of the raised feature 250 may be about 5 microns and its height of the raised feature above a plane of the substrate may be about 1 micron. The radius of curvature of the raised feature 150 may be less than about 5 microns, and preferably less than about 3 microns. The raised feature may have a generally cylindrical, spherical or pyramidal shape, for example, pointed at the top on a broader base. The detailed shape of the raised feature may be a result of the technique used to create it. The raised feature 250 may be a continuous perimeter around a device, as shown in FIG. 2, or it may be a plurality of discrete raised features spaced some distance apart from one another. Preferably, the plurality of raised features would be spaced close enough together such that the thermocompression bond is still achieved and the bond is still hermetic. The plurality of raised features may therefore form a series, spaced around and generally encircling, or around, a device.

Figure 1B:
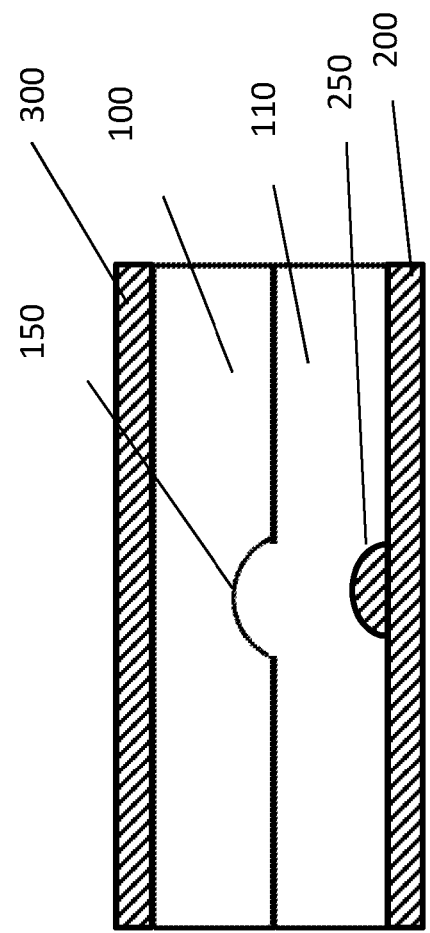
FIG. 1B is a schematic cross sectional diagram of the bonding layers and raised feature after bonding.

The width of the bonding planes may be between about 50 microns and about 200 microns. After bonding these surfaces may appear as shown in FIG. 1B. Importantly, the raised feature 150 is completely embedded in the material of the first metal layer, upper surface 100. More generally, when the first substrate is pressed against the second substrate to form a substrate pair, the raised feature is completely embedded in the first metal layer. Because the first substrate and the second substrate are flat, a contact area of the thermocompression bond may comprise at least about 75% of the width of the bondline. In some embodiments, the percentage of the bond line that is bonded is the width of the bondline minus the mis-alignment divided by the width. Typically the width is 50 um and the mis-alignment is 2 um, resulting in percent bonded area of around 96%.

FIG. 2 is a plan view of the bond, the device cavity and the enclosed device. This bond line 210 and raised feature 250 may form a substantially hermetic seal ring around a die or device 220. As shown in FIG. 2, the width of the first metal layer and the second metal layer may be about 50 microns to about 200 microns, which may define a width of a bondline of the same dimension, about 50 microns to about 200 microns. The first metal layer and the second metal layer may both comprise at least one of gold, aluminum and copper of a thickness between about 0.5 microns and 6 microns. A microfabricated device 220, such as a MEMS or an integrated circuit (IC) may be formed on either the first or the second substrate. Importantly, as can be seen in FIG. 2, the raised feature 250 may form a continuous perimeter around the device 220.

Figure 3A:
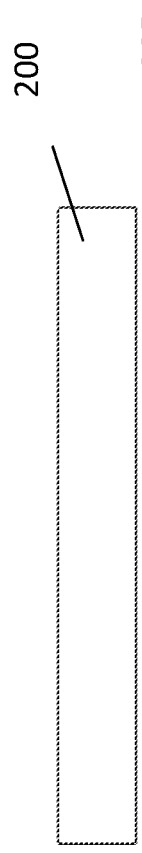
FIGS. 3A, FIG. 3B, FIG. 3C, FIG. 3D, FIG. 3E and FIG. 3F illustrate a process for forming the raised feature.
Figure 3B:
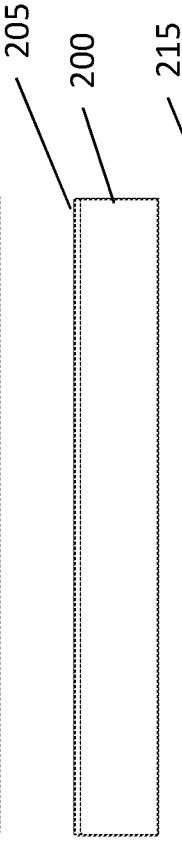
Figure 3C:
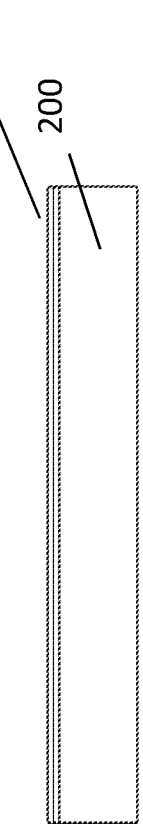
Figure 3D:
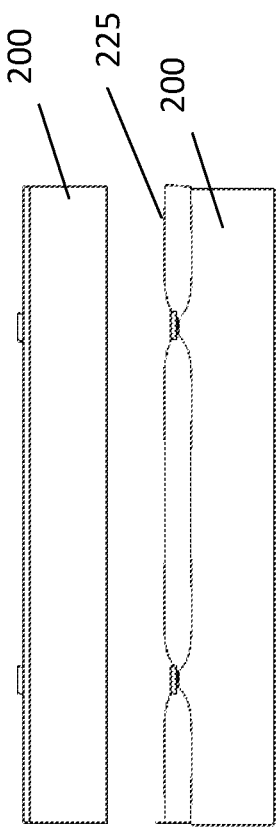
Figure 3E:
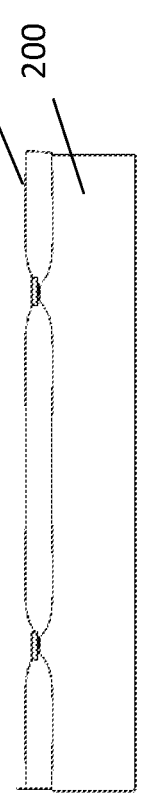

In one embodiment, the raised feature 250 is formed in the surface of substrate 200, and comprises the material of the substrate 200. FIGS. 3a-3f illustrate the process to form the raised feature in this embodiment. Starting with a silicon substrate 200 (FIG. 3A), a pad oxide layer 205 of 300-1000 A thickness may be grown as a stress relief layer (FIG. 3B). Next in FIG. 3C, a low pressure chemical vapor deposition (LPCVD) deposits a layer 215 of $Si_3N_4$, followed by a patterning process to prevent the local oxidation of the underlying Si, as shown in FIG. 3D. The width of this patterned feature will determine the radius of curvature of the raised feature. At this point, a thick thermal oxide 225 is grown as shown in FIG. 3E. The thickness of this oxide layer is roughly twice that of the required raised feature height. Finally, in FIG. 3F the thermal oxide is chemically etched away, leaving the raised features 250.

In order to form the raised feature 250 in substrate 200 more generally, i.e. in other sorts of substrate materials, the following procedure may be used: First form a first oxide layer over the substrate surface, then deposit a layer of hard mask over first oxide layer, pattern the hard mask and the first oxide layer; and form a second oxide layer over the substrate; and finally remove the second oxide layer to leave the raised feature in the substrate. In some embodiments, the second oxide layer may be about twice a thickness of the hard mask layer. Using silicon substrates specifically, the method for forming the raised feature may include forming a layer of silicon nitride on a silicon wafer, patterning the layer of silicon nitride; growing a thick thermal oxide on the silicon substrate; and etching the thermal oxide away, to leave the raised feature. As before, the thickness of the thermal oxide may be about twice the thickness of the silicon nitride layer.

To fabricate the bonded wafer pair using this technique, the method may include providing a first and a second substrate, providing a raised feature the first substrate; forming a first layer of a metal over the raised feature on the first substrate, pressing the first substrate against the second substrate to form a substrate pair, with a temperature, pressure and duration sufficient to achieve a thermocompression bond, and bonding the substrate pair with a thermocompression bond between the first metal layer and the second metal layer, around the raised feature, wherein most adhesive bonding strength between the first substrate and the second substrate is in the vicinity of the raised feature as a result of thermocompression bond.

It should be understood that the method may also be applied to other types of substrates in addition to silicon. For example, a glass, metal, semiconductor or ceramic substrate may be used on which a raised feature of another mechanically competent material is deposited. Silicon nitride, for example, may be formed on a semiconductor substrate using chemical vapor deposition (CVD). The gold layers 100 and 110 may then deposited conformally over this raised feature, and the process proceeds as previously described.

Figure 3F:
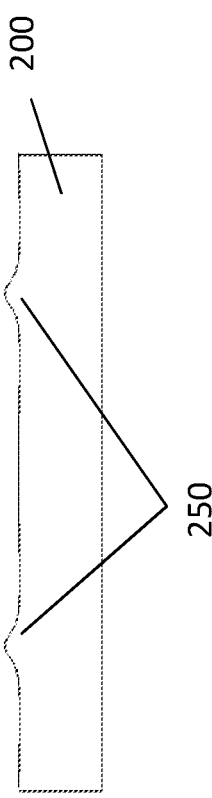

The process then provides for the layers previously described with respect to FIGS. 1a and 1b to be applied over the silicon substrate 200 as was shown in FIG. 3F. A first gold layer described above may be deposited on a first silicon substrate 100, and a second gold layer may be formed over the second substrate 200 with raised feature 250. The substrates may then be pressed together with a heat and pressure sufficient to achieve the gold-gold thermocompression bond. For the case of gold (Au) layers on silicon substrates, a bonding temperature may be between 200 and 450° C. with an applied force above 40 kN for 20 to 45 min may generally be sufficient to achieve the bond. Accordingly, when the first metal layer and the second metal layer both comprise gold, the pressure may be about 40 kN and the duration may be about 45 minutes, and the temperature may be about 200 to about 450 centigrade. More generally, and for other materials such as aluminum (Al) or copper (Cu), the first substrate may be pressed against the second substrate with a pressure of about 20 to 80 kN for at least about 20 minutes, at a temperature of between about 200 centigrade and 450 centigrade, and wherein the first metal layer and the second metal layer both comprise at least one of gold, aluminum and copper.

Under the loading pressure applied during bonding, the raised feature is completely embedded in the opposing surface, as was shown in FIGS. 1a and 1b. This brings the two bonding planes into contact. Thus the high initial pressure of the raised feature on the opposing surface provides for a hermetic bond without fracture of the raised feature Meanwhile, the complete embedding of the raised feature into the opposing surface allows for the two bonding surfaces to come into contact. This large contact area provides for high strength as shown in FIG. 1B.

For an Al thermocompression bond, the bonding temperature can be from 400 to 450° C. with an applied force above 70 kN for 20 to 45 minutes. For Cu, a bonding temperature of around 380 to 450° C. with an applied force between 20 to 80 kN for 20 to 60 min may be sufficient.

Figure 4:
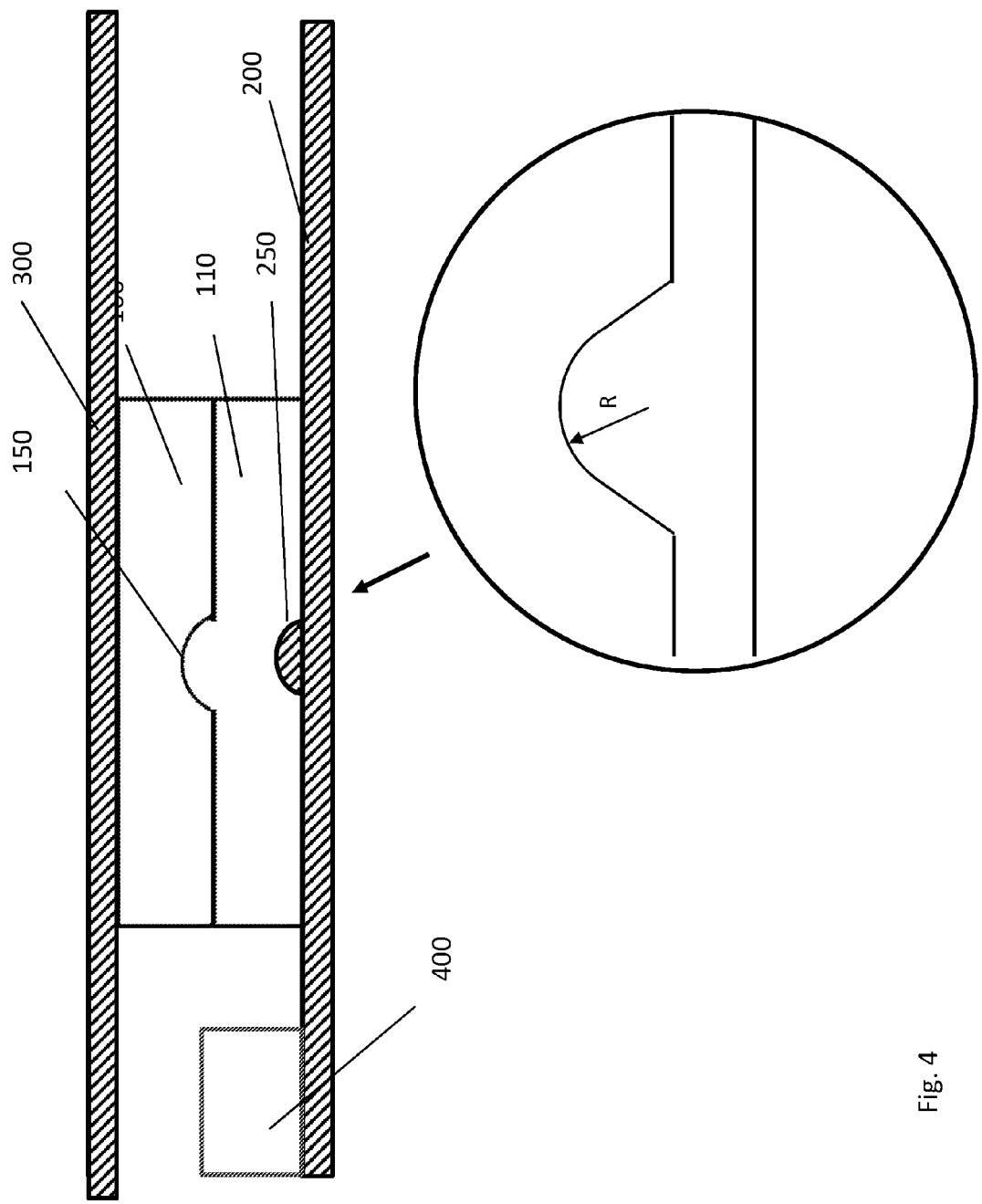
FIG. 4 is a schematic cross sectional diagram of the bonding layers and raised feature during and after bonding, illustrating the lateral profile and radius of curvature of the raised feature.

The lateral cross sectional profile shown in FIG. 4 illustrates the advantageous details of the raised features used herein. The figure shows the first layer 100 on one substrate 300 and the second layer of metal 110 on the second substrate 200. In one embodiment, the second substrate 200 may have the raised feature 250 formed thereon. The raised feature 250 may be the same material as the second substrate 200, such that no material or morphological boundary may exist between the raised feature 250 and the second substrate 200. Accordingly, in one embodiment, the raised feature 250 comprises silicon and the second substrate also comprises silicon. The raised feature 250 comprises the material of the substrate, because it is made by consuming and/or removing adjacent substrate material adjacent to the raised feature. The manufacturing methodology may advantageously for a raised feature 250 with a radius of curvature as shown. This radius of curvature refers to the cross sectional profile of the raised feature. The radius of curvature may be on the order of less than about 5 microns and more preferably less than about 3 microns. However it is important that the apex of the raised feature be somewhat rounded, i.e. greater than about 0.5 microns. For smaller radii of curvature, excessive pressure may be applied to the metal layer 100.

Accordingly, a bond between a first substrate and a second substrate is described. The bond may comprise a first metal layer on the first substrate, a raised feature on the second substrate having a peak, and a second metal layer over the second substrate and the raised feature, wherein adhesive bonding strength is due to a thermocompression bond between the first metal layer and the second metal layer in a vicinity of the raised feature, wherein the peak of the raised feature has a radius of curvature in its lateral cross sectional profile of less than about 5 microns, and this peak is embedded in the bond. The bond 1000 is shown in FIG. 4 as the combination of metal layer 100 and 110. This thermocompression bond 1000 adheres the substrates 200 and 300, wherein the adhesive bonding strength is due to the thermocompression bonding of 100 and 110. The bond 1000 may form a hermetic seal around a MEMS or other microfabricated device 400, shown laterally adjacent to the bond.

It should be clearly understood that the radius of curvature as specified herein, refers to the curvature of the surface of the raised feature, as seen in the lateral cross sectional profile. I.e. if the bondline formed by the first metal layer 100 and the second metal layer 110 encloses a device 500 as shown in FIG. 4, the lateral cross sectional profile is that shown, and the raised feature peak 250 has this radius of curvature. This is the peak that will penetrate into the metal layers as described above.

Figure 5:
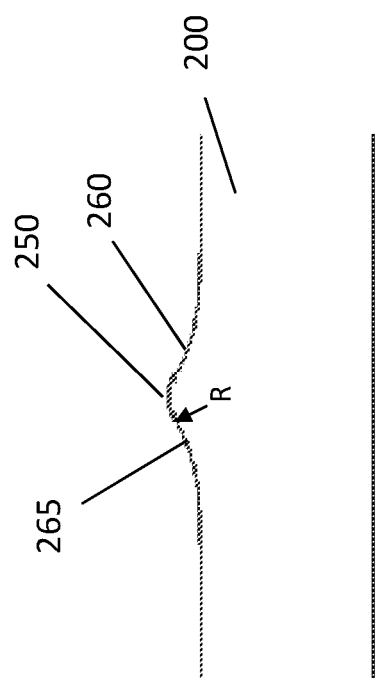
FIG. 5 is a schematic cross sectional diagram of the raised feature made by the LOCOS process.

FIG. 5 shows a raised feature made by the LOCOS process (Local Oxidation of Silicon). This process was described with respect to FIG. 3a-3f. The LOCOS process involves the masking of a portion of the silicon substrate and the oxidation of the unmasked portion. This oxidation consumes some of the adjacent silicon material, and is subsequently removed. Upon removal, a silicon raised feature results which has exactly the desired contour as shown in FIG. 5.

Comparison of FIG. 5 to FIG. 4 shows that the raised feature 250 may comprise the same material as the substrate 200, because it is made by consuming and/or removing substrate material adjacent to the raised feature 250. The manufacturing methodology which advantageously generates a raised feature with the advantageous radius of curvature may be LOCOS. and the radius of curvature may be on the order of less than about 5 microns and more preferably less than about 3 microns. However, the apex of the raised feature is still somewhat rounded, i.e. greater than about 0.5 microns. As explained above, a range of radii of curvature in the range 0.5 microns to about 3 microns is suitable. Using this shape of raised feature of sufficient mechanical competency assures that the pressures necessary for the thermocompression bond are achieved in the vicinity of the raised feature. Yet the apex is sufficiently rounded that the substrate is not in danger of breakage.

In addition to the peak 250 in the raised feature, the LOCOS process may yield a raised feature with a gradual shoulder on each side of the peak. The shoulder regions are also shown in FIG. 5 as reference numbers 260 and 265. These features may also be a result of the LOCOS fabrication process, and as such, the topography of the raised feature 250 is substantially different that the topography of a feature which is defined lithographically. A lithographically defined feature tends to have sharp corners and orthogonal edges.

While various details have been described in conjunction with the exemplary implementations outlined above, various alternatives, modifications, variations, improvements, and/or substantial equivalents, whether known or that are or may be presently unforeseen, may become apparent upon reviewing the foregoing disclosure. Accordingly, the exemplary implementations set forth above, are intended to be illustrative, not limiting.

What is claimed is:

1. A bond between a first substrate and a second substrate, comprising:
   a first metal layer on the first substrate;
   a raised feature on the second substrate having a peak, wherein the raised feature encircles a device; and
   a second metal layer over the second substrate and the raised feature, wherein adhesive bonding strength is due to a thermocompression bond between the first metal layer and the second metal layer in a vicinity of the raised feature, wherein the peak of the raised feature has a radius of curvature in its lateral cross sectional profile of less than about 5 microns, and the peak is embedded in the bond.

2. The bond of claim 1, wherein the second substrate and the raised feature are both silicon.

3. The bond of claim 1, wherein the first metal layer and the second metal layer are both gold, with a thickness of about 0.5 to 6 microns.

4. The bond of claim 1, wherein the raised feature has a radius of curvature in its lateral cross sectional profile of less than about 3 microns.

5. The bond of claim 1, wherein the first substrate and the second substrate comprise at least one of glass, metal, semiconductor or ceramic.

6. The bond of claim 1, wherein the raised feature is completely embedded in the first metal layer.

7. The bond of claim 1, wherein a width of the raised feature is about 5 microns and a height of the raised feature above a plane of the substrate is about 1 micron.

8. The bond of claim 1, wherein a width of the first metal layer and the second metal layer is about 50 microns to about 200 microns, which defines a width of a bondline of the same dimension, about 50 microns to about 200 microns.

9. The bond of claim 1, wherein the raised feature comprises at least one of a continuous perimeter and a plurality of discrete raised features spaced some distance apart from one another, around the device.

10. The bond of claim 1, wherein the first metal layer and the second metal layer both comprise at least one of gold, aluminum and copper of a thickness between about 0.5 microns and 6 microns.

* * * * *